July 5, 1966 J. A. RADO 3,259,848

HIGH VOLTAGE CASCADED SEMICONDUCTOR AMPLIFIER
INCLUDING FEEDBACK AND PROTECTIVE MEANS

Filed Nov. 18, 1963 3 Sheets-Sheet 1

INVENTOR.
JOHN A. RADO,
BY J. K. Haskell
ATTORNEY.

July 5, 1966 J. A. RADO 3,259,848

HIGH VOLTAGE CASCADED SEMICONDUCTOR AMPLIFIER INCLUDING FEEDBACK AND PROTECTIVE MEANS

Filed Nov. 18, 1963 3 Sheets-Sheet 2

INVENTOR.
JOHN A. RADO,
BY J. K. Haskell
ATTORNEY.

July 5, 1966 J. A. RADO 3,259,848
HIGH VOLTAGE CASCADED SEMICONDUCTOR AMPLIFIER INCLUDING FEEDBACK AND PROTECTIVE MEANS
Filed Nov. 18, 1963 3 Sheets-Sheet 3
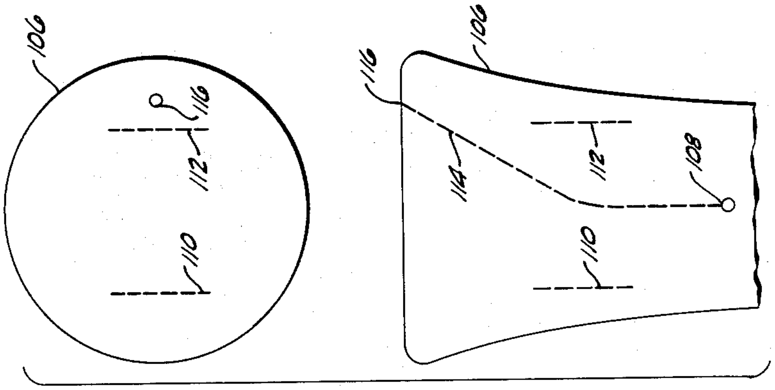
FIG. 4c. (time $t_2^-$)
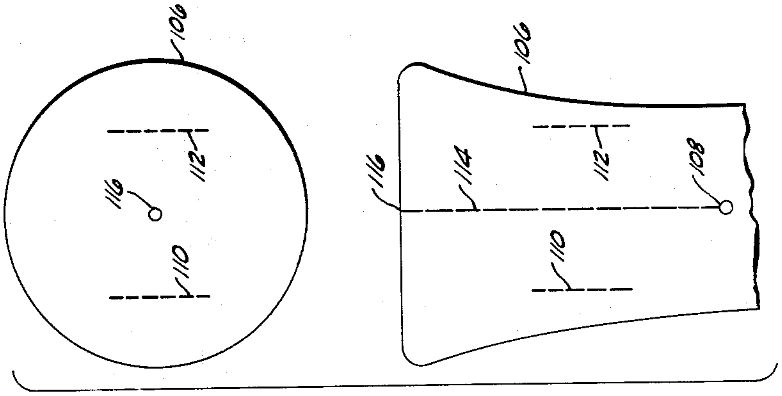
FIG. 4b. (time $t_1$)
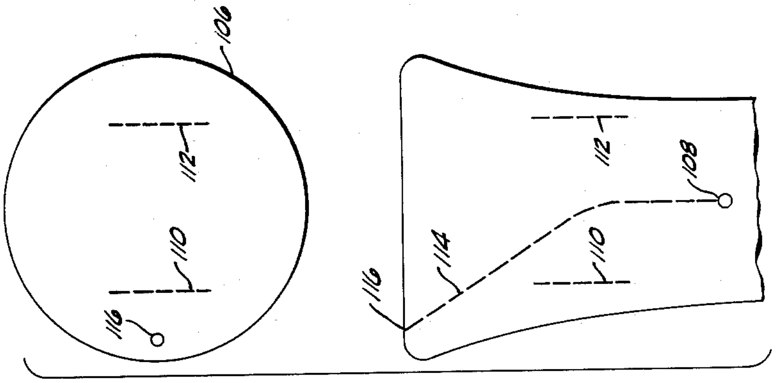
FIG. 4a. (time $t_0$)
INVENTOR.
JOHN A. RADO,
BY J. K. Haskell
ATTORNEY.

United States Patent Office 3,259,848

Patented July 5, 1966

3,259,848

HIGH VOLTAGE CASCADED SEMICONDUCTOR AMPLIFIER INCLUDING FEEDBACK AND PROTECTIVE MEANS

John A. Rado, Los Angeles, Calif., assignor to Hughes Aircraft Company, Culver City, Calif., a corporation of Delaware Filed Nov. 18, 1963, Ser. No. 324,373
2 Claims. (Cl. 330—14)

This invention relates to semiconductor amplifiers and more particularly to such amplifiers for providing output voltages larger than those which can be provided by a single semiconductor.

Heretofore vacuum tube amplifiers have been used to supply large voltages such as those used for electrostatic deflection of electron beams in cathode ray tubes, but such amplifiers have the disadvantages of large weight, volume, and power consumption. Attempts to overcome these disadvantages by the use of semiconductors have had limited success because of the limited collector-to-emitter breakdown potential of individual semiconductors. Voltage dividing arrangements to overcome this disadvantage by using semiconductors with their collector-emitter current paths in series have heretofore proved unreliable because of difficulty in maintaining an unvarying division ratio among the semiconductors over the signal cycle thereby resulting in subjecting individual semiconductors to potential drops in excess of their breakdown ratings. Achieving linearity has also been a problem.

It is therefore an object of this invention to provide an improved semiconductor amplifier.

It is a further object of this invention to provide an improved semiconductor amplifier for supplying voltages larger than those which can be supplied by a single semiconductor.

Another object of this invention is to provide an improved semiconductor amplifier for supplying linear voltages larger than those which can be supplied by a single semiconductor.

It is a further object of this invention to provide an improved amplifier for supplying voltages for electrostatic deflection of electron beams.

Briefly, in accordance with this invention a semi-conductor amplifier is provided for supplying voltages larger than those which can be supplied by a single semiconductor comprising a plurality of semiconductor devices each having a collector-emitter current path and a control electrode, the collector-emitter paths being connected in series between a load impedance element connected to one source of operating potential and a current-determining impedance element connected to another source of operating potential, and the control electrode of one of the semiconductors being coupled to a source of input signals. The amplifier also comprises biasing means including a stabilized voltage source for each of the semiconductor devices other than the one whose control electrode is connected to the input signal source and a bias current-determining impedance element connected between each of the stabilized voltage sources and the control electrode of the corresponding semiconductor device. Equal division of the output voltage among the semiconductor devices in the series arrangement is obtained by matching the semiconductor devices with respect to current gain and suitably proportioning each base biasing impedance element. Diode clamping between collector electrodes and stabilized voltage sources protects each semiconductor device requiring such special protection from exceeding its rated collector-to-emitter breakdown voltage during its nonconducting phases. Linearity is improved by two inverse feedback loops, one within a preamplifier comprising part of the input signal source and the other between the final output of the series arrangement of semiconductor devices and the input of the preamplifier.

The novel features of this invention, both as to its organization and method of operation will best be understood from the accompanying description of a specific exemplary embodiment taken in connection with the accompanying drawings, in which like characters refer to like parts, and in which.

Figure 1:
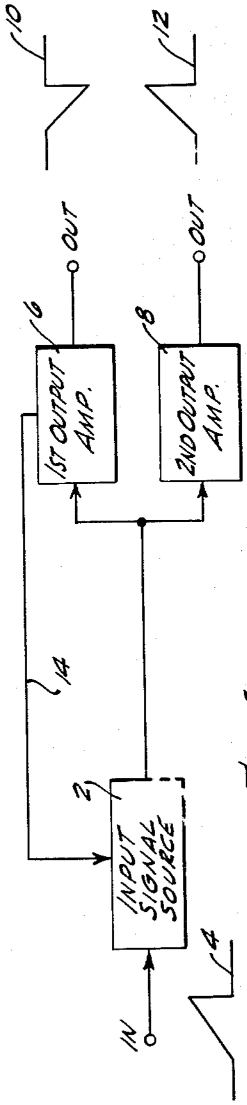
FIG. 1 is a block diagram of a semiconductor amplifier provided in accordance with this invention for providing voltages for electrostatic deflection of an electron beam in a cathode ray tube.

Referring now to FIG. 1, an input signal source 2 is shown for accepting and amplifying an input signal of predetermined waveform 4 such as a positive-going sawtooth. Two substantially symmetrical output amplifiers 6, 8 are coupled to the signal source 2 in such manner, to be explained below, that when one is cut off the other conducts most heavily and when the conducting one swings toward cutoff in response to a given input signal the nonconducting one swings toward saturation in response to the same signal, whence the output voltages, represented by waveforms 10, 12, of the two output amplifiers 6, 8 are inverse to each other. A feedback loop 14 from the first output amplifier 6 to the input signal source 2 provides overall inverse feedback for improving linearity.

Figure 2:
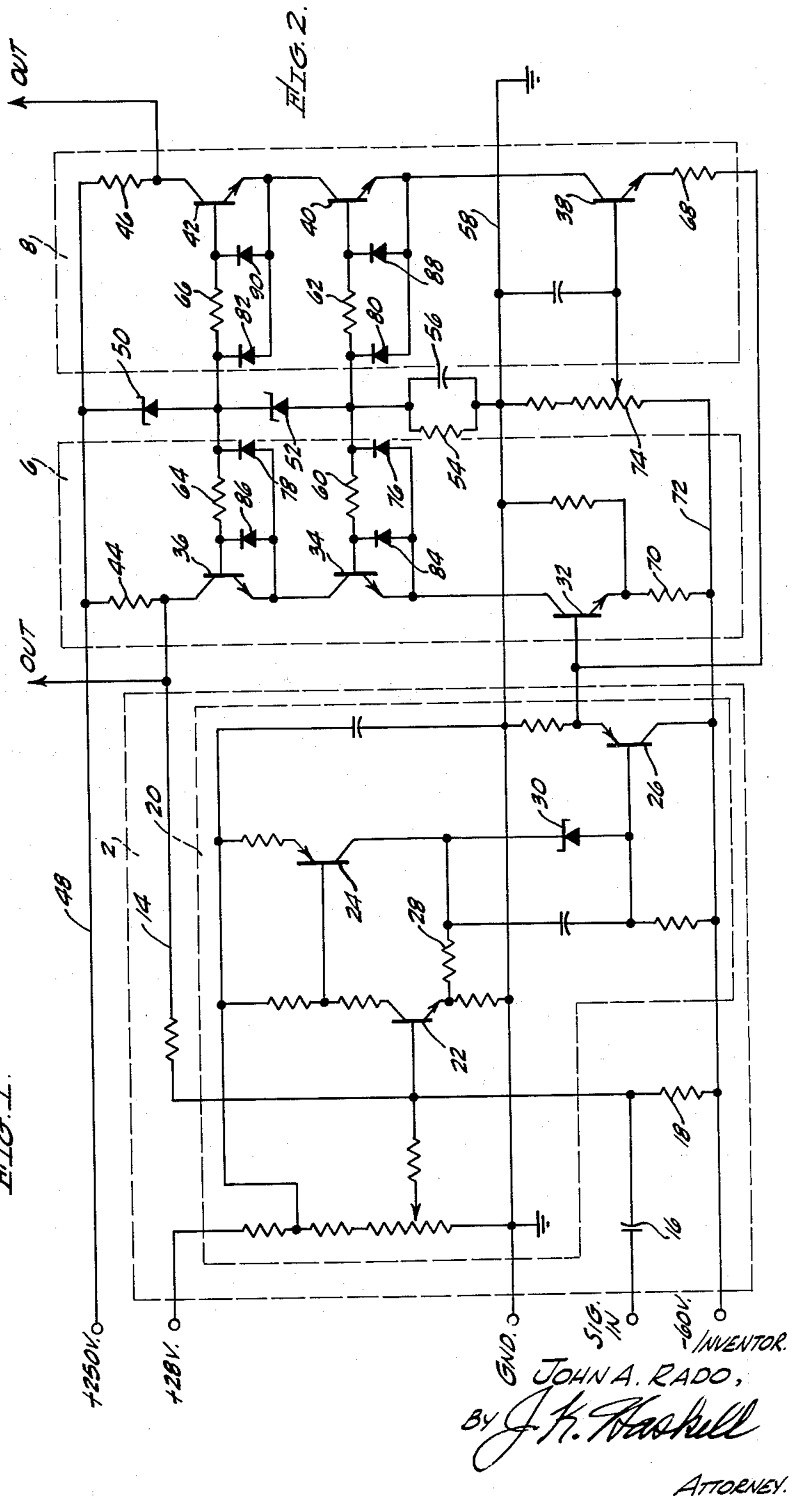
FIG. 2 is a schematic circuit diagram of the semiconductor amplifier of FIG. 1.

FIG. 2 shows the input signal source 2 including an input coupling capacitor 16 and resistor 18 and a preamplifier 20. The preamplifier 20 includes two gain stages comprising first and second transistors 22, 24 in cascade and a low impedance coupling circuit comprising a third transistor 26 in an emitter-follower circuit configuration. Linearity is improved by current feedback from the second transistor 24 to the first transistor 22 by way of a feedback resistor 28. A first zener diode 30 couples the output of the second transistor 24 directly to the emitter-follower transistor 26 while shifting the average level of the amplified signal developed for application to the output amplifiers 6, 8.

The first output amplifier 6 comprises fourth, fifth, and sixth transistors 32, 34, 36 with their collector-to-emitter current paths connected in series to form a dynamic first conductor, and the second output amplifier 8 comprises seventh, eighth, and ninth transistors 38, 40, 42 similarly connected to form a dynamic second conductor. The phrase "dynamic conductor" is used herein to mean a circuit element comprising variable impedance elements connected in series and capable of conduction, nonconduction or partial conduction. First and second load impedance elements 44, 46 are connected between a first source of direct current operating potential 48 and the collectors of the sixth and ninth transistors 36, 42, respectively. Biasing means are provided, including a combination of two stabilized voltage sources comprising second and third zener diodes 50, 52 connected in series and, in series therewith, a parallel subcombination of a bleeder resistor 54 and a capacitor 56 for passing transients. One end of this combination is connected to the first source of direct current operating potential 48 and the other to a source of fixed reference potential 58, in this case ground. First and second base biasing resistors 60, 62 are respectively connected between the anode of the third zener diode 52 and the base electrodes of the transistors corresponding thereto, namely, the fifth and eighth transistors 34, 40, and third and fourth base biasing resistors 64, 66 are respectively connected between the anode of the second zener diode 50 and the base electrodes of the transistors corresponding thereto, namely, the sixth and ninth transistors 36, 42.

The effect of the transistor series arrangement of the first output amplifier 6 is to provide means for the division among the first output amplifier transistors 32, 34, 36 of the total potential drop between the collector of the sixth transistor 36 and the emitter of the fourth transistor 32, none of the transistors being separately capable of withstanding a collector-to-emitter voltage as high as the required total potential drop. Moreover, by matching the first output amplifier transistors 32, 34, 36 with respect to current gain and by suitably proportioning the values of the first output amplifier base resistors 60, 64 the instantaneous collector-to-emitter voltages appearing across the first output amplifier transistors 32, 34, 36 will be equalized over the signal cycle. Like results, that is, the division of total potential drop and the equalizing of instantaneous collector-to-emitter voltages, are achieved in the operation of the second output amplifier 8 by matching the second output amplifier transistors 38, 40, 42 with respect to current gain and proportioning the values of the second output amplifier base resistors 62, 66.

To obtain output voltage waveforms 10, 12 (FIG. 1) comprising signals which are inverse to each other the emitter-follower transistor 26 is coupled to the first output amplifier 6 by directly connecting the emitter-follower transistor 26 and the base electrode of the fourth transistor 32 and by connecting conductor-current-determining impedance element 68 between the emitter of the seventh transistor 38 and the emitter-follower transistor 26, another conductor-current-determining impedance element 70 being connected between the emitter of the fourth transistor 32 and a second source of direct current operating potential 72, and the base electrode of the seventh transistor 38 being connected to an adjustable intermediate tap of a potentiometer 74 included among the biasing means and connected between the source of fixed reference potential 58 and the second source of direct current operating potential 72. As a result of this arrangement the fourth transistor 32 is biased to be nonconducting and the seventh transistor 38 to be conducting during the quiescent portion of the input signal waveform 4 (FIG. 1). Also as a result of this arrangement a positive-going signal from the emitter-follower transistor 26 will drive the fourth transistor 32 toward conduction and the seventh transistor 38 toward nonconduction simultaneously, and a negative-going signal from the emitter-follower transistor 26 will have the opposite effects.

FIG. 2 shows a first protective diode 76 connected between the collector electrode of the fourth transistor 32 and the anode of the third zener diode 52. It also shows a second protective diode 78 connected between the collector electrode of the fifth transistor 34 and the anode of the second zener diode 50. The first protective diode 76 prevents the collector of the fourth transistor 32 from going more positive than the anode of the third zener diode 52 whenever the fourth transistor 32 is in a nonconducting condition while the fifth and sixth transistors 34, 36 are conducting. It is to be noted in this connection that the stored charge in the junctions of the fifth and sixth transistors 34, 36 may not dissipate as fast as the charge stored in the junctions of the fourth transistor 32. This depends on the relative time constants involved. Thus, if a negative-going voltage step is impressed upon the base of the fourth transistor 32 by the emitter-follower transistor 26, the fourth transistor 32 will stop conducting quickly because minority carrier charges in the base-emitter junction of the fourth transistor 32 will be quickly withdrawn into the emitter circuit of the emitter-follower transistor 26, which is not only a low impedance coupling circuit in general, but which is preferred here because its output impedance is lowered still further whenever it develops a negative-going signal. By way of contrast, however, the fifth and sixth transistors 34, 36 have no such low impedance sink for their stored minority carriers, and they therefore remain in conduction for a longer time. In the absence of the first protective diode 76 the collector-to-emitter voltage of the fourth transistor 32 would, during the decay period of the fifth transistor 34, approach the total potential drop between the first source of direct current operating potential 48 and the emitter of the fourth transistor 32, a drop which may be far in excess of the rated breakdown voltage of the fourth transistor 32. It should be noted, additionally that the fifth transistor 34 is protected by the second protective diode 78 in a similar manner when the fifth transistor 34 stops collector-emitter conduction and loses its stored charge.

The sixth transistor 36 does not require such diode protection, since it cannot stop conduction before the fifth transistor 34 does so. The reason for this is that while the fifth transistor 34 is conducting, its collector must be below the potential of the anode of the second zener diode 50, hence, there must be a negative potential at the emitter of the sixth transistor 36 with respect to the anode of the second zener diode 50 and therefore there must be current flow from the anode of the second zener diode 50 through the third base-biasing impedance element 64, the base-emitter junction of the sixth transistor 36, the collector-emitter path of the fifth transistor 34 and the first protective diode 76 to the anode of the third zener diode 52. If there is base-emitter current flow in the sixth transistor 36, its collector-emitter impedance is low, its collector-emitter current flows, and its collector-emitter voltage drop is less than breakdown rating.

A third protective diode 80 is connected between the collector of the seventh transistor 38 and the anode of the third zener diode 52, while a fourth protective diode 82 is connected between the collector of the eighth transistor 40 and the anode of the second zener diode 50. These respectively serve purposes with respect to the seventh and eighth transistors 38, 40 entirely analogous to the purposes respectively served by the first and second protective diodes 76, 78 with respect to the fourth and fifth transistors 32, 34.

Other diodes 84, 86, 88, 90 are connected directly between the emitter and base electrodes of the fifth, sixth, eighth, and ninth transistors 34, 36, 40, 42 respectively, to prevent reverse base-emitter bias from building up as a result of stray capacitance.

The resistor 54 connected between the anode of the third zener diode 52 and the source of fixed reference potential 58 acts as a bleeder resistor to maintain current in the second and third zener diodes 50, 52. The capacitor 56 connected in parallel with the resistor 54 supplies the necessary current to the protective diodes 76, 78, 80, 82 during the transient which occurs whenever the fourth, fifth, seventh, or eighth transistors 32, 34, 38, 40 stop conducting. The second and third zener diodes 50, 52 cannot supply this transient current because they are poled in the wrong direction to do so. The capacitance of the capacitor 56 is many orders of magnitude greater than the input capacitance of the fourth transistor 32, hence little change of voltage above the reference potential of the anode of the third zener diode 52 can occur.

Figure 3:
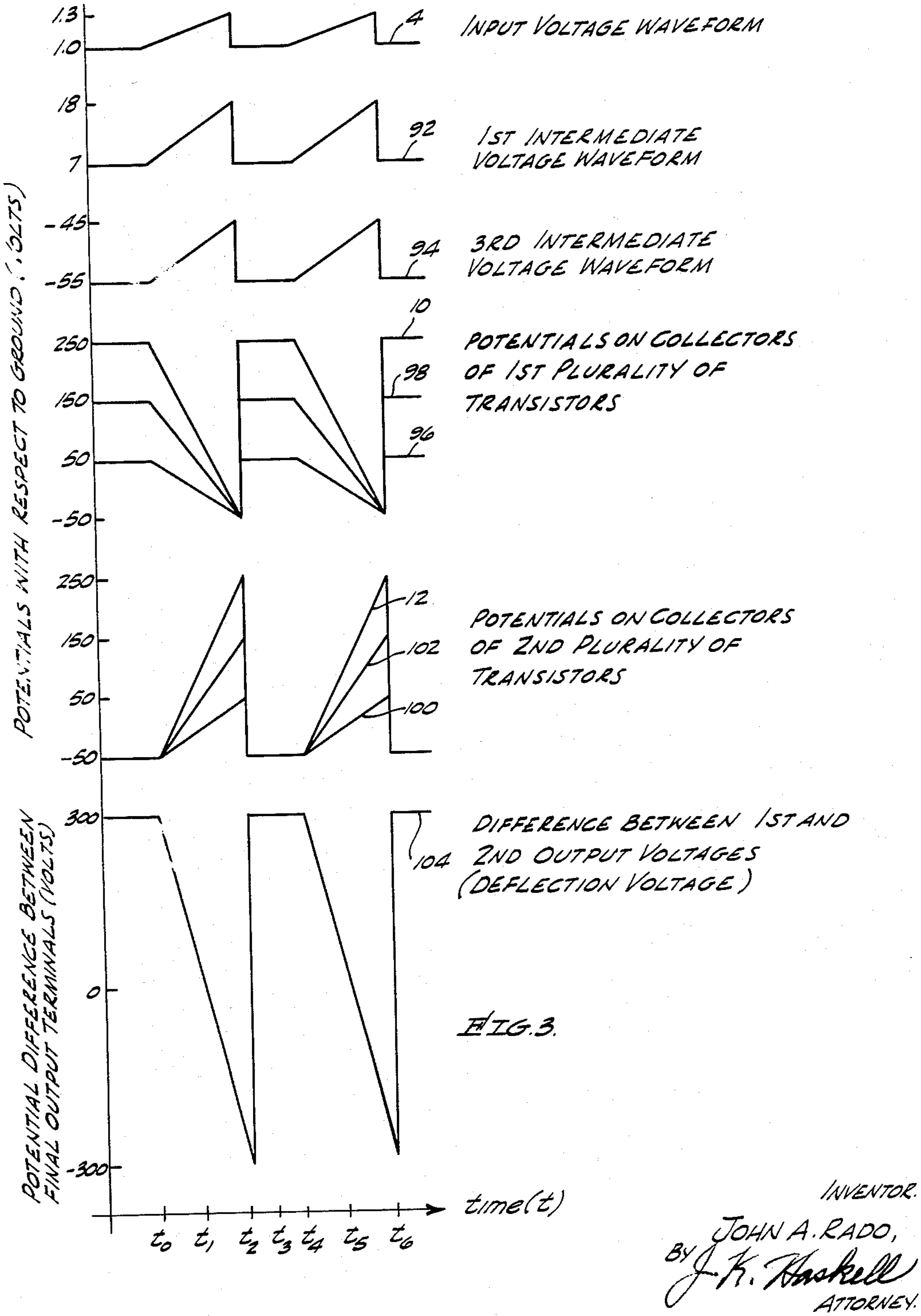
FIG. 3 is a diagram of voltage waveforms for explaining the operation of the circuit of FIG. 2; and FIGS. *4a*, *4b* and *4c* are simplified diagrams of a portion of a cathode ray tube to help in describing the final output of the circuit of FIG. 2.

Referring now to FIG. 3, the present invention will be further explained in terms of signal voltage waveforms. With the input voltage waveform 4 to the preamplifier 20 (FIG. 2) comprising a sawtooth signal having a peak-to-peak value of 0.3 volt, the second transistor 24 provides a first intermediate voltage waveform 92 comprising a sawtooth signal having a value of approximately 10 volts peak-to-peak. A second intermediate voltage waveform (not shown) applied to the emitter-follower transistor comprises a signal of the same sawtooth configuration as the first intermediate voltage waveform 92, but its average level with respect to ground has been dropped approximately 62 volts by the first zener diode 30 (FIG. 2). A third intermediate voltage waveform 94 comprises the signal which is applied by the emitter-follower transistor 26 (FIG. 2) to the base electrode of the fourth transistor 32 (FIG. 2) and the conductor-current-determining impedance element 68 connected to the emitter of the seventh transistor 38.

Because of the coupling arrangements between the two output amplifiers 6, 8 and the preamplifier 20, explained heretofore, the collectors of the fourth, fifth, and sixth transistors 32, 34, 36 respectively exhibit fourth and fifth intermediate voltage waveforms 96, 98 and the first output voltage waveform 10, while the collectors of the seventh, eighth, and ninth transistors 38, 40, 42 respectively exhibit sixth and seventh intermediate voltage waveforms 100, 102 and the second output voltage waveform 12 which are inverse to the first three. It will be noticed from these waveforms that the transistors in each output amplifier 6, 8 operate together to divide the full deflection voltage among themselves. For example, in the quiescent state before time $t_0$ or at time $t_3$ the fourth, fifth, and sixth transistors 32, 34, 36 in the first output amplifier 6 are nonconducting and the respective collector potentials with respect to ground are 50, 150, and 250 volts, indicating equal collector-to-emitter potentials of about 100 volts, whereas the seventh, eighth, and ninth transistors 38, 40, 42 in the second output amplifier 8 are conducting and the respective collector potentials with respect to ground are approximately —50 volts indicating negligible collector-to-emitter voltages.

At time $t_0$, when the positive-going portion of the sawtooth signal of the third intermediate voltage waveform 94 is applied to the base of the fourth transistor amplifier 32 it is also applied to the conductor-current-determining impedance element 68 connected to the emitter of the seventh transistor 38. As a result, during the period between $t_0$ and $t_2$ as for example at time $t_1$ the fourth, fifth and sixth transistors 32, 34, 36 are driven toward full conduction, lowering their collector voltages proportionately, as shown in the fourth and fifth intermediate voltage waveforms 96, 98 and the first output voltage waveform 10 to a minimum of —50 volts. Also as a result, the seventh, eighth and ninth transistors 38, 40, 42 are meanwhile driven toward cutoff, raising their collector voltages proportionately, as shown in the sixth and seventh intermediate voltage waveforms 100, 102 and the second output voltage waveform 12 to respective maxima of 50, 150, and 250 volts with respect to ground.

At time $t_2$, when the input voltage waveform 4 drops sharply, the first intermediate voltage waveform 92, the second intermediate waveform (not shown) and the third intermediate waveform 94 also drop sharply as a result, and the fourth, fifth and sixth transistors 32, 34, 36 are accordingly driven sharply to cutoff, raising their collector voltages from —50 to 50, 150 and 250 respectively. At the same time the seventh, eighth and ninth transistors 38, 40, 42 are accordingly driven sharply into full conduction, reducing their collector voltages from respective values of 50, 150, 250 to a common value of —50.

If the first and second output voltage waveforms 10, 12 are not compared to a fixed reference potential such as ground but are instead compared with each other, the potential difference is as shown in the deflection voltage waveform 104. This shows that the voltage excursion of the output terminal of the first output amplifier 6 is from +250 volts to —50 volts concurrently with an excursion of the output terminal of the second output amplifier from —50 volts to +250 volts. The resulting total swing is 600 volts, being the algebraic sum $$[250-(-50)]-[-50-(+250)]$$

Referring now to FIG. 4, a portion of a cathode ray tube (CRT) 106 is shown in front and side views. Also shown are an electron gun 108, a pair of deflection plates 110, 112 and an electron beam 114 terminating in a spot 116 on the CRT screen. If the collector electrodes of the sixth and ninth transistors 36, 42 are respectively connected to the deflection plates 110, 112 and if the input voltage waveform 4 is fed into the preamplifier 20, the deflection voltage waveform 104 will cause a deflection of the electron beam 114 and a corresponding sweep of spot 116 as shown in FIG. 4*a* for time $t_0$, 4*b* for time $t_1$ and 4*c* for an instant before time $t_2$, assuming appropriate values for the energy of the electron beam and for the CRT dimensions.

The foregoing description has been exemplary only and not intended to limit the scope of the invention to the device illustrated in the drawings. FIG. 2, for example, shows N-P-N transistors in the output amplifiers 6, 8, yet P-N-P transistors would do equally well with appropriate adjustment of operating and biasing potentials. Similarly, any low impedance voltage source or voltage regulator would equally well serve the purpose of the second and third zener diodes 50, 52, though perhaps at some sacrifice in the way of weight or volume.

Other alternative embodiments of the present invention include a semiconductor amplifier as described above but without the second output amplifier 8 and another semiconductor amplifier with either two semiconductors or more than three semiconductors connected in series in the output amplifiers. If the second output amplifier 8 were eliminated, of course, the output would be limited to the output of the first output amplifier with respect to ground or some other reference point. The advantage of changing the number of semiconductors in each amplifier would be that both smaller and larger deflection voltage swings could be produced.

Other embodiments include other arrangements for coupling the input signal source 2 to the output amplifiers 6, 8 such as the use of a common emitter impedance element (not shown) for the fourth and seventh transistors 32, 38 or, alternatively, the use of separate emitter impedance elements for those transistors 32, 38 meanwhile coupling the base electrodes thereof to input signal means providing oppositely phased signals. In connection with the circuit means for coupling the output amplifiers 6, 8 to the input signal source 2, note that the emitter-follower circuit configuration utilized for the third transistor 26 is only one of several possible low impedance coupling circuits and further, that a low impedance signal source, while required in connection with the circuit means utilized for coupling the output amplifiers 6, 8 to the input signal source 2 in the preferred embodiment, may not be required where other circuit means are used for such coupling.

There has thus been disclosed a semiconductor amplifier for providing large output voltages which has advantages in weight, volume, and power consumption over vacuum tube deflection amplifiers known heretofore and which has advantages in voltage output and reliability over semiconductor amplifiers known heretofore.

What is claimed is:

1. A linear semiconductor amplifier for providing output voltages larger than those which can be provided by a single semiconductor comprising:

a low impedance source of input signals of predetermined waveform including input means for providing said signals and a multistage preamplifier for amplifying said signals coupled with said input means, said preamplifier including feedback means coupled between stages thereof for improving linearity of the amplifier signals and including a low impedance coupling circuit for developing said amplifier signals;

first and second sources of direct current operating potential and a source of fixed reference potential;

first and second pluralities of semiconductor devices including a collector-emitter current path and a control electrode for controlling current in said path, the paths of the semiconductor devices of said first plurality being connected in series to provide a dynamic first conductor with one electrode of the path of a first of the semiconductor devices of said first plurality forming a first terminal of said first conductor and one electrode of the path of a second of the semiconductor devices of said first plurality forming a second terminal of said first conductor, the paths of the semiconductor devices of said second plurality being connected in series to provide a dynamic second conductor with one electrode of the path of a first of the semiconductor devices of said second plurality forming a first terminal of said second conductor and one electrode of the path of a second of the semiconductor devices of said second plurality forming a second terminal of said second conductor, first and second load impedance elements being respectively connected between said first terminals and said first source of direct current operating potential, and additional feedback means being coupled between one of said first terminals and said preamplifier for improving linearity of said output voltages;

biasing means for each of said semiconductor devices including an adjustably tapped impedance element connected between said source of fixed reference potential and said second source of direct current operating potential and including a stabilized voltage source for each of said semiconductor devices other than said second semiconductor devices and a bias current-determining impedance element connected between each of said stabilized voltage sources and the control electrode of the corresponding semiconductor device, said bias current-determining impedance element connected to each of said corresponding semiconductor devices of said first plurality being proportioned and the semiconductor devices of said first plurality being matched with respect to current gain to provide substantially equal instantaneous voltage drops across each of said devices of said first plurality, and said bias current-determining impedance element connected to each of said corresponding semiconductor devices of said second plurality being proportioned and the semiconductor devices of said second plurality being matched with respect to current gain to provide substantially equal instantaneous voltage drops across each of said devices of said second plurality;

circuit means for determining current flow in said conductors and providing oppositely phased changes in current magnitude therein in response to said input signals including a conductor current-determining impedance element connected between said second terminal of said second conductor and said source of input signals and including another conductor current-determining impedance element connected between said second terminal of said first conductor and said second source of direct current operating potential, said control electrode of said second semiconductor of said first plurality being connected to said low impedance coupling circuit, and said control electrode of said second semiconductor of said second plurality being connected to an intermediate tap of said adjustably tapped impedance element; and unilaterally conducting protective means connected between each of said stabilized voltage sources and the collector electrode of the current path of the semiconductor device immediately preceding said corresponding semiconductor device for limiting the instantaneous collector-emitter voltage of said preceding semiconductor device to less than breakdown potential.

2. A linear semiconductor amplifier for providing output voltages for electrostatic deflection of electron beams comprising:

a low impedance source of input signals of predetermined waveform including input means for providing said signals and a multistage preamplifier for amplifying said signals coupled with said input means, said preamplifier including feedback means coupled between stages thereof for improviding linearity of the amplified signals and a low impedance coupling circuit for developing said amplified signals;

first and second sources of direct current operating potential and a source of fixed reference potential;

first and second numerically equal pluralities of semiconductor devices including a collector-emitter current path and a control electrode for controlling current in said path, the paths of the semiconductor devices of said first plurality being connected in series to provide a dynamic first conductor with one electrode of the path of a first of the semiconductor devices of said first plurality forming a first terminal of said first conductor and one electrode of the path of a second of the semiconductor devices of said first plurality forming a second terminal of said first conductor, the paths of the semiconductor devices of said second plurality being connected in series to provide a dynamic second conductor with one electrode of the path of a first of the semiconductor devices of said second plurality forming a first terminal of said second conductor and one electrode of the path of a second of the semiconductor devices of said second plurality forming a second terminal of said second conductor, first and second load impedance elements being respectively connected between said first terminals and said first source of direct current operating potential, and additional feedback means being coupled between one of said first terminals and said preamplifier for improving linearity of said output voltages;

biasing means for each of said semiconductor devices including an adjustably tapped impedance element connected between said source of fixed reference potential and said second source of direct current operating potential and including a stabilized voltage source for each pair of said semiconductor devices of like order in said conductors other than said second semiconductor devices and a bias current-determining impedance element connected between each of said stabilized voltage sources and the control electrode of each of the corresponding semiconductor devices, said bias current-determining impedance element connected to each of said corresponding semiconductor devices of said first plurality being proportioned and the semiconductor devices of said first plurality being matched with respect to current gain to provide substantially equal instantaneous voltage drops across each of said devices of said first plurality, and said bias current-determining impedance element connected to each of said corresponding semiconductor devices of said second plurality being proportioned and the semiconductor devices of said second plurality being matched with respect to current gain to provide substantially equal instantaneous voltage drops across each of said devices of said second plurality;

circuit means for determining current flow in said conductors and providing oppositely phased changes in current magnitude therein in response to said input signals including a conductor current-determining impedance element connected between said second terminal of said second conductor and said source of input signals and including another conductor current-determining impedance element connected between said second terminal of said first conductor and said second source of direct current operating potential, said control electrode of said second semiconductor of said first plurality being connected to said low impedance coupling circuit, and said control electrode of said second semiconductor of said second plurality being connected to an intermediate tap of said adjustably tapped impedance element; and unilaterally conducting protective means connected between each of said stabilized voltage sources and the collector electrodes of the current paths of the respective semiconductor devices immediately preceding said corresponding semiconductor devices for limiting the instantaneous collector-emitter voltage of said preceding semiconductor devices to less than breakdown potential.

References Cited by the Examiner

UNITED STATES PATENTS

| | | | |
|---|---|---|---|
| 2,926,307 | 2/1960 | Ehret | 330—18 |
| 3,001,144 | 9/1961 | Dandl | 330—18 X |
| 3,018,446 | 1/1962 | Knudson | 330—18 X |
| 3,024,422 | 3/1962 | Jansson | 330—18 |

FOREIGN PATENTS

| | | | |
|---|---|---|---|
| 1,143,859 | 2/1963 | Germany. | |

ROY LAKE, *Primary Examiner.*

F. D. PARIS, *Assistant Examiner.*